US007255927B2

(12) United States Patent
Choate et al.

(10) Patent No.: US 7,255,927 B2
(45) Date of Patent: Aug. 14, 2007

(54) LAMINATE COMPOSITION

(75) Inventors: Martin Choate, Onalaska, WI (US);
Gregory J. Libke, Chandler, AZ (US);
Peggy Conn, LaCrosse, WI (US); Steve Peters, Rockland, WI (US)

(73) Assignee: Isola USA Corp., Chandler, AZ (US)

( * ) Notice: Subject to any disclaimer, the term of this patent is extended or adjusted under 35 U.S.C. 154(b) by 0 days.

(21) Appl. No.: 10/385,044

(22) Filed: Mar. 10, 2003
(Under 37 CFR 1.47)

(65) Prior Publication Data
US 2004/0146728 A1 Jul. 29, 2004

Related U.S. Application Data

(63) Continuation-in-part of application No. 10/310,418, filed on Dec. 5, 2002, now abandoned, and a continuation-in-part of application No. 10/309,720, filed on Dec. 4, 2002, now Pat. No. 7,090,924.

(60) Provisional application No. 60/363,576, filed on Mar. 12, 2002, provisional application No. 60/337,362, filed on Dec. 5, 2001, provisional application No. 60/337,322, filed on Dec. 5, 2001.

(51) Int. Cl.
*B32B 15/08* (2006.01)
*B32B 27/18* (2006.01)
*B32B 27/26* (2006.01)
*B32B 27/28* (2006.01)

(52) U.S. Cl. .................. 428/458; 428/457; 428/473.5; 428/327; 428/403; 428/412; 106/15.05; 106/18.11; 106/18.24; 106/18.35; 524/464; 524/341; 524/371; 524/370; 570/190; 570/206; 525/180; 525/183; 525/439; 525/466

(58) Field of Classification Search .............. 428/458, 428/473.5; 106/15.05, 18.11, 18.24, 18.35; 442/136, 146, 164, 172, 228, 232, 234, 235, 442/316, 376, 378
See application file for complete search history.

(56) References Cited

U.S. PATENT DOCUMENTS

| 3,855,239 | A | * | 12/1974 | Crivello | 548/521 |
|---|---|---|---|---|---|
| 4,168,366 | A | * | 9/1979 | D'Alelio | 525/426 |
| 4,923,933 | A | * | 5/1990 | Curry | 525/439 |
| 5,008,477 | A | * | 4/1991 | Hussain | 570/208 |
| 5,030,778 | A | * | 7/1991 | Ransford | 570/208 |
| 5,077,334 | A | * | 12/1991 | Hussain | 524/469 |
| 5,160,781 | A | * | 11/1992 | Yoshioka et al. | 442/146 |
| 5,324,874 | A | * | 6/1994 | Ransford et al. | 570/208 |
| 5,401,890 | A | * | 3/1995 | Parks | 570/211 |
| 5,457,248 | A | * | 10/1995 | Mack et al. | 570/206 |
| 5,741,949 | A | * | 4/1998 | Mack | 568/639 |
| 6,008,283 | A | * | 12/1999 | Rose et al. | 524/411 |
| 6,031,036 | A | * | 2/2000 | Rosenquist et al. | 524/164 |
| 6,063,839 | A | * | 5/2000 | Oosedo et al. | 523/206 |
| 6,117,371 | A | * | 9/2000 | Mack | 252/609 |

(Continued)

FOREIGN PATENT DOCUMENTS

JP 09-183896 * 7/1997

*Primary Examiner*—Vivian Chen
(74) *Attorney, Agent, or Firm*—McDonnell Boehnen Hulbert & Berghoff LLP

(57) ABSTRACT

This invention concerns a thermosetting resin system that is useful in the manufacture of high performance prepreg, laminate and composite materials as well as, prepregs, laminates and composites made from the thermosetting resin composition.

20 Claims, 1 Drawing Sheet

U.S. PATENT DOCUMENTS 6,214,923 B1 * 4/2001 Goto et al. .................. 524/514
6,518,468 B1 * 2/2003 Parks et al. ................. 570/190
6,534,594 B1 * 3/2003 Kimura et al. .............. 525/100
6,743,825 B1 * 6/2004 Dawson et al. ............. 514/754
2001/0047118 A1 * 11/2001 Parks et al. ................. 570/185
2005/0266756 A1 * 12/2005 Hendricks et al. .......... 442/232

* cited by examiner

LAMINATE COMPOSITION

CROSS REFERENCE TO RELATED APPLICATIONS

This application claims priority from U.S. Provisional Application Ser. No. 60/363,576,filed Mar. 12, 2002. This application is also a continuation in part of U.S. patent application Ser. No. 10/309,720, filed Dec. 4, 2002 U.S. Pat. No. 7,090,924, which claims the benefit of U.S. Provisional Application Ser. No. 60/337,362, filed Dec. 5, 2001. This application is also a continuation in part of U.S. patent application Ser. No. 10/310,418, filed Dec. 5, 2002 abandoned, which claims the benefit of U.S. Provisional Application Ser. No. 60/337,322, filed Dec. 5, 2001. The disclosure of each of the above documents is incorporated herein by reference in its entirety.

BACKGROUND OF THE INVENTION (1) Field of the Invention

This invention concerns a thermosetting resin composition that includes decabromodiphenylethane and that is useful in the manufacture of high performance prepreg, laminate and composite materials as well as the prepregs, laminates and composites made from the thermosetting resin composition.

(2) Description of the Related Art

Plastics have certain mechanical and structural properties that can be improved when the plastics are combined with reinforcing components. Composites formed of various fibers embedded in a polymer resin matrix, for example, are especially useful. However, such compositions are susceptible to enormous physical property variations depending upon, for example, the nature of the fiber used, how the fiber is utilized, and the fiber matrix or binder. The uses for such composites range from airframes to tennis rackets and from boat hulls to rocket motor casings, and laminates for use, for example, as multilayer printed circuit boards in the electronics industry.

Polyimide materials have been used in multilayer printed circuit boards for a number of years because of the generally favorable flammability and electrical properties of such materials. V1 polyimide type resin systems used today, however, are marginally acceptable in the industry and have a high level of within sample-sample and within sample variation in flammability testing. There is a need, therefore, for improvements in the flammability properties of resin systems so that composites made therefrom can, for example, consistently pass UL 94 V1 flammability requirements.

SUMMARY OF THE INVENTION

This invention provides a thermosetting resin composition useful in the manufacture of high performance composite and laminate materials. The resin composition comprises: a resin system and decabromodiphenylethane.

This invention also provides prepregs, laminates and composites manufactured from the disclosed resin compositions.

DESCRIPTION OF THE CURRENT EMBODIMENT

Figure 1:
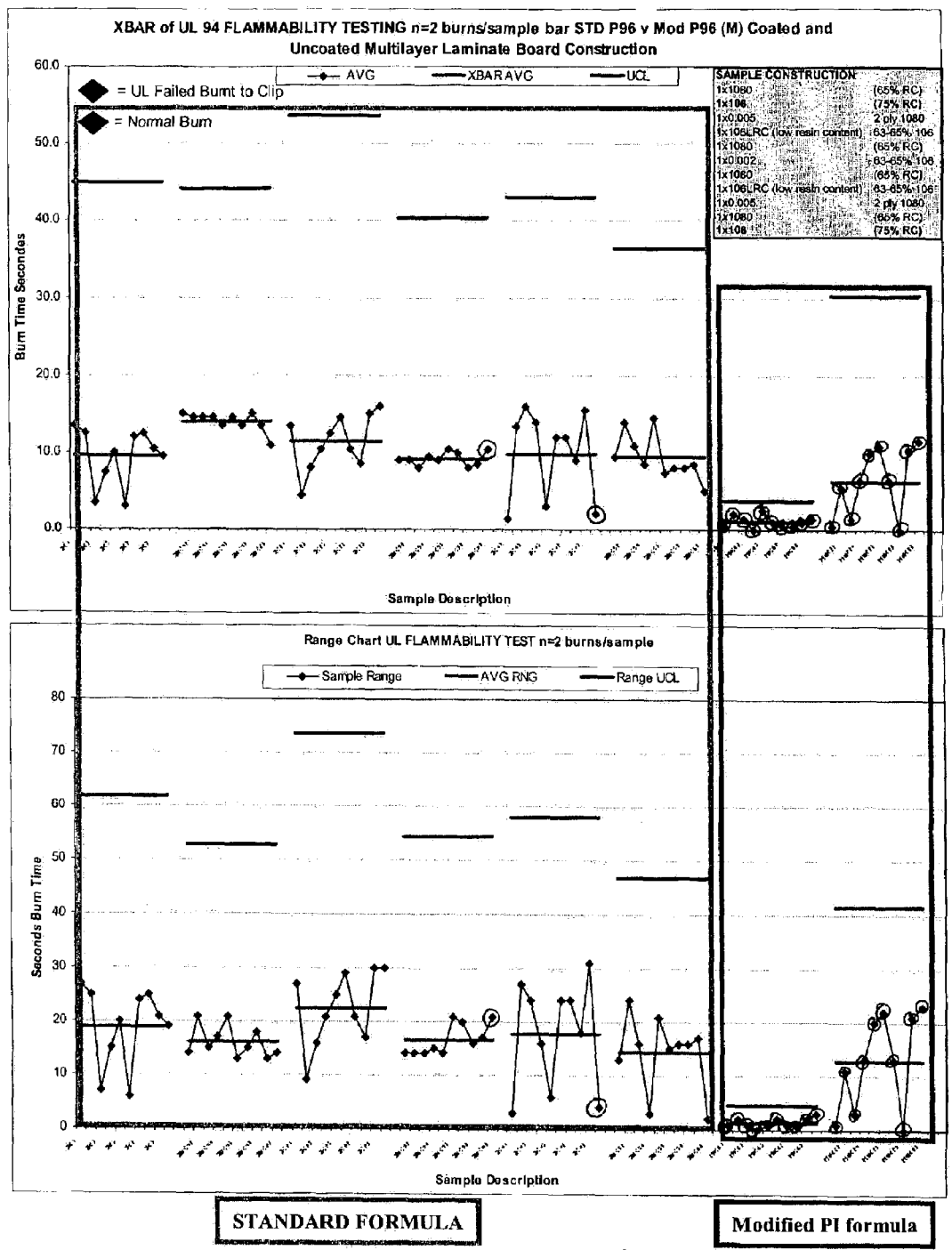
FIG. 1 are plots of the flammability test results for resin systems with and without decabromodiphenylethane wherein the test results indicate that the resin systems including decabromodiphenylethane pass the UL flammability tests while resin systems without decabromodiphenylethane do not.

This invention provides thermosetting resin compositions useful in the manufacture of high performance composite materials, and prepregs, laminates and composites manufactured therefrom. The compositions are particularly useful in the preparation of laminate products that meet UL 94 V1 standard flammability requirements while maintaining the excellent drilling and processing capability of the laminate. The resin composition of the invention provides laminates having consistently reduced within sample-sample and within sample variation in flammability testing and can consistently pass UL 94 V1 or more stringent flammability requirements.

An important ingredient of the resin systems of this invention is decabromodiphenylethane which has the following structure:

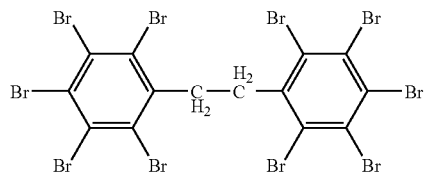

Decabromodiphenylethane is commercially available, for example, from Albemarle Corporation (451 Florida St., Baton Rouge, La. 70801). The Albemarle product is sold as Saytex™ 8010. Decabromodiphenylethane has been found to serve several important and unexpected functions in resin compositions used in laminates. Decabromodiphenylethane improves the flammability properties of laminates including decabromodiphenylethane-containing resins. And decabromodiphenylethane prevents the precipitation of and/or settling of ingredients from the uncured resin systems. Decabromodiphenylethane should be included in resin systems in amounts sufficient to impart the desired flame retardant and/or resin dispersion properties to the cure resin. Decabromodiphenylethane will typically be included in resin systems in an amount ranging from about 0.1 to about 20 wt % on a dry basis with a range of from about 2 to about 5 wt % being preferred.

Decabromodiphenylethane can be incorporated into any resin system to improve the flammability of the resulting cured resin. Examples of resin systems with which decabromodiphenylethane can be combined include epoxy based resin systems. A preferred resin system is a polyimide resin or polyimide-containing resin system. Examples of preferred polyimide resins or polyimide-containing resin systems include, but are not limited to, bismaleimide resins, and polyester imide resins. A particularly useful resin system is Kerimid® 701 which is a multi-component modified bismaleimide resin system based on non-MDA (methylene dianiline) chemistry and is sold by Vantico (Brewster, N.Y.). The product contains Kerimid® 701A (a bismaleimide) and either 701B (a brominated hardener) or 701C (a crosslinker and a curing agent) or both 701B and 701C, which are mixed together to form the polyimide resin system.

One or more fillers can optionally be added to the resin compositions of this invention to improve chemical and electrical properties of the cured resin. Examples of properties that can be modified with fillers include, but are not limited to, coefficient of thermal expansion, lowering CTE, increasing modulus, and reducing prepreg tack. Non-limiting examples of useful fillers include particulate forms of Teflon®, talc, quartz, ceramics, particulate metal oxides such as silica, titanium dioxide, alumina, ceria, clay, boron nitride, wollastonite, and mixtures thereof. Preferred fillers include calcined clay or fused silica. Yet another preferred filler is silane treated silica. When used, fillers are present in the thermosetting resin compositions of this invention in an amount from about 0% to about 20%, preferably from about 0 to about 10%, based on 100% by weight solids of the composition.

The thermosetting resin compositions of this invention may include one or more tougheners. The tougheners are added to the resin compositions to improve the drillability of the resulting composites and laminates. Useful tougheners include methyl methacrylate/butadiene/styrene copolymer, methacrylate butadiene styrene core shell particles, and mixtures thereof. A preferred toughener is methacrylate butadiene styrene core shell particles, which is available from Rohm & Haas (100 Independence Mall West, Philadelphia, Pa.), sold under the trade name Paraloid®. When used, tougheners are present in the thermosetting resin compositions of this invention in an amount from about 1% to about 5%, preferably from about 2 to about 4%, based on 100% by weight solids of the composition.

One or more curing agents are optionally added to the thermosetting resin compositions of this invention in order to enhance the rate of resin cure. The curing agents chosen may be any agents that are know to speed up the rate of thermosetting resin cure. Preferred curing agents include peroxide agents that generate free radicals such as dicumyl peroxide, or tert-butyl peroxybenzoate (commercially available from, for example, Akzo-Nobel Polymer Chemicals LLC, Chicago, Ill. as Triganox-C). Other preferred curing agents include metal acetylacetonate complexes (metal acac). A more preferred curing agent is dicumyl peroxide. When used, curing agents are present in the thermosetting resin compositions of the invention preferably in an amount of from about 0% to about 30%, more preferably from about 12% to about 25%, based on 100% by weight resin solids of the composition.

The thermosetting resin compositions of this invention may include one or more flame retardants in addition to decabromodiphenylethane. Any flame retardant that is known to be useful in resin compositions used to manufacture composites and laminates may be used. Examples of useable flame retardants include, but are not limited to, halides of glycidyl etherified bifunctional alcohols, halides of novolac resins such as bisphenol A, bisphenol F, polyvinylphenol or phenol, creosol, alkylphenol, catecohl, and novolac resins such as bisphenol F, inorganic flame retardants such as antimony trioxide, red phosphorus, zirconium hydroxide, barium metaborate, aluminum hydroxide, and magnesium hydroxide, and phosphor flame retardants such as tetraphenyl phosphine, tricresyl-diphenyl phosphate, triethylphosphate, cresyldiphenylphosphate, xylenyl-diphenyl phosphate, acid phosphate esters, phosphate compounds containing nitrogen, and phosphate esters containing halides.

One or more solvents are typically incorporated into the thermosetting resins of this invention in order to provide resin solubility, control resin viscosity, and in order to maintain the resin ingredients in a suspended dispersion. Any solvent known by one of skill in the art to be useful in conjunction with thermosetting resin systems can be used. Particularly useful solvents include methylamylketone (MAK), methylethylketone (MEK), toluene, gamma-butyrolactone (BLO), propylene glycol methyl ethyl ether acetate (PMA), or mixtures thereof. The choice of solvent is often dictated by the resin curing method. When the resin is cured with hot air, then ketones are typically the preferred solvent. When the resins are IR cured, then a mixture of ketones and toluene is typically preferred. When used, solvents are present in the thermosetting resin compositions of this invention in an amount of from about 20% to about 50% as a weight percentage of the total weight of the composition.

Optionally, the thermosetting resin composition of the present invention may further contain other additives such as defoaming agents, leveling agents, dyes, and pigments. For example, a fluorescent dye can be added to the resin composition in a trace amount to cause a laminate prepared therefrom to fluoresce when exposed to UV light in a board shop's optical inspection equipment. A useful fluorescent dye is a highly conjugated diene dye. One example of such a dye is UVITEX® OB (2,5-thiophenediylbis(5-tert-butyl-1,3-benzoxazole), available from Ciba Specialty Chemicals, Tarrytown, N.Y.

A particularly useful resin system is a three part polyimide resin system sold by Vantico under the trade name kerimid® 701A, 701B and 701C, discussed above. The preferred resin composition includes the following ingredients in the following amounts wherein the weight percent is reported on a dry basis:

| Ingredient | Range (wt %) | Preferred Range (Wt. %) |
|---|---|---|
| Decabromodiphenylethane | 0.1–20 | 2–5 |
| Polyimide (Part 1) | 35–100 | 40–65 |
| Brominated Polycarbonate (Part 2) | 0–20 | 5–15 |
| Curing Agent (Part 3) | 0–30 | 12–25 |

Another particularly useful resin system is as follows, wherein the weight percent is reported as a dry basis:

| Ingredient | Range (wt %) | Preferred Range (Wt. %) |
|---|---|---|
| Decabromodiphenylethane | 1–6 | 2–3 |
| Polyimide resin system (e.g., Kerimid ® A and C) | 88–98 | 94–96 |
| Toughener (e.g., Paraloid ® 2691A) | 1–5 | 2–4 |

As indicated above, the resin composition of the invention provides laminates having consistently reduced within sample-sample and within sample variation in flammability testing and can consistently pass UL 94 V1 or more stringent flammability requirements. Favorable flammability characteristics of the compositions of the invention are further illustrated in FIG. 1.

Specifically, in the FIG. 1, the bar through each set of points represents the average burn time. The points that are not circled represent samples that burned to the clip—this represents an undesirable speedy burn—and the points that are circled represent samples that did not burn to the clip. With this description of the plots in mind one can conclude (1) samples made with the decabromodiphenylethane modified formula had lower burn times; (2) no samples made with the decabromodiphenylethane modified formula burned to the clip; (3) the average burn time for samples made with the decabromodiphenylethane modified formula were lower than the average burn times of samples made with the standard formula; and (4) 58 of 60 samples made with the standard formula burned to the clip.

The thermosetting resin compositions of this invention are useful for making prepregs in a continuous process. Prepregs are generally manufactured using a core material such as a roll of woven glass web which is unwound into a series of drive rolls. The web then passes into a coating area where the web is passed through a tank which contains the thermosetting resin system of this invention, solvents and other components. The glass web becomes saturated with the resin in the coating area. The resin saturated glass web is then passed through a pair of metering rolls which remove excess resin from the resin saturated glass web and thereafter, the resin coated web travels the length of a drying tower for a selected period of time until the solvent is evaporated from the web. A second and subsequent coating of resin can be applied to the web by repeating these steps until the preparation of the prepreg is complete whereupon the prepreg is wound onto roll.

Lamination processes typically entail a stack-up of one or more prepreg layers between one or two sheets of conductive foil (such as copper foil). Lamination methods and parameters may vary widely, and are generally well known to the person of ordinary skill in the art. In a typical cure cycle, the stack is maintained at a pressure of about 40 psi to about 900 psi and under a vacuum of about 30 in/Hg. The stack temperature is raised from about 180° F. to about 375° F. over a period of about 20 minutes. The stack remains at a temperature of about 375° F. for 75 minutes after which the stack is cooled from a temperature of 375° F. to a temperature to 75° F. over a 20 minute period.

In another process for manufacturing laminates, thermosetting resins of this invention are premixed in a mixing vessel under ambient temperature and pressure. The viscosity of the premix is ~600-1000 cps and can be adjusted by adding or removing solvent from the resin. Fabric substrate (typically but not limited to E glass) is pulled through a dip tank including the premixed resin, through an oven tower where excess solvent is driven off and the prepreg is rolled or sheeted to size, layed up between Cu foil in various constructions depending on glass weave style, resin content & thickness requirements.

The thermosetting resin mix can also be coated directly on Cu substrate (RCC—resin coated Cu) using slot-die or other related coating techniques.

The following example is illustrative of various aspects of the invention but does not serve to limit its scope.

EXAMPLE

Two resin systems—a "Standard Resin Systems" without decabromodiphenylethane and a "Modified PI formula" including decabromodiphenylethane were prepared as set forth below wherein the weight percent amounts of the ingredients are reported on a finished basis.

| Ingredient | Standard Formula | Modified PI formula |
| --- | --- | --- |
| Polyimide | 57 | 55.0 |
| Brominated polycarbonate | 10.3 | 10.0 |
| Curing agent | 18.1 | 17.5 |
| Decabromodiphenylethane | 0 | 3.5 |
| BLO (solvent) | 14.5 | 14.0 |

The resin system, supplied as 701A, 701B and 701C by Vantico, was premixed in a separate mixing vessel under ambient temperature and pressure. The DBDPE is then added into the mixing vortex solution as the last component and the mixture was mixed at normal rpm continued for 1 hour or until apparent homogeneity is achieved. The resin was further diluted to 150-250 cps with MAK and fed into a dip tank. A woven glass fabric substrate was pulled through the dip tank through an oven tower, and excess solvent was removed in the heated oven tower.

Composites manufactured with the two resin systems were then tested using the UL 94 V1 standard. The test results are reported in FIG. 1 which shows that few if any composites manufactured with the standard formula resin exhibited V1 flammability while the composites manufactured with the modified resin formula achieved V1 flammability.

The formulas of the primary ingredients used in the resin system of this example are reproduced below.

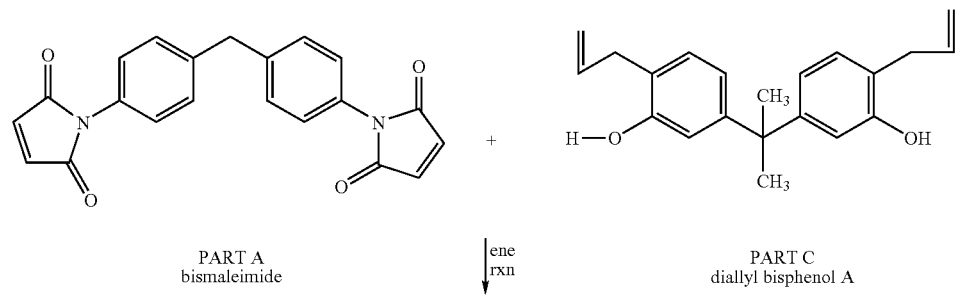

PART A
bismaleimide ene
rxn

PART C
diallyl bisphenol A

-continued
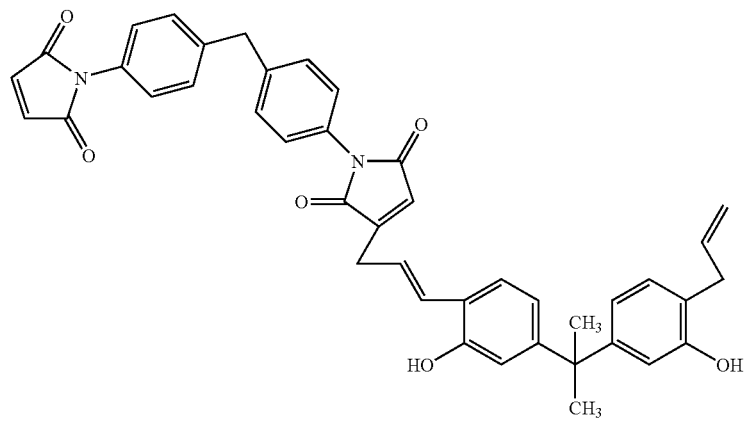
↓ heat
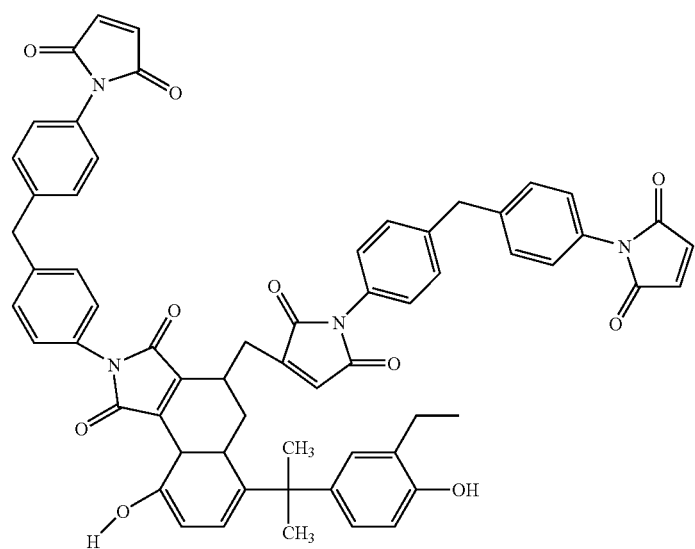
KERMID 701A + 701C CROSSLINKED BMI
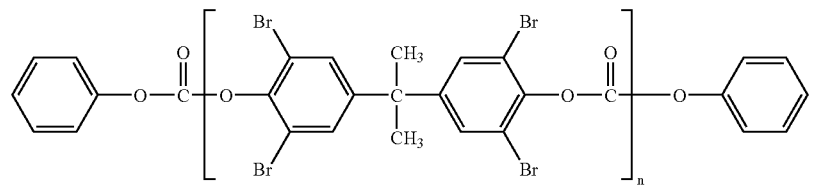
PART B
Phenoxy terminated carbonate of Tetrabromobisphenol A
Formula Wt 5,300
Bromine Content 53.9 %
CAS no. 94334-64-2

-continued

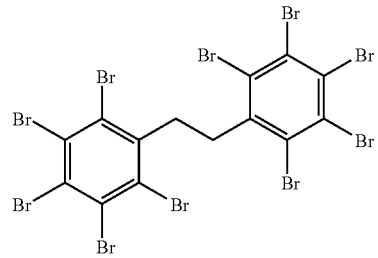

decabromodiphenylethane

Other resin additives were evaluated by the methods above, but none were found to have the synergistic effect of decabromodiphenylethane. The following observations are based in these experimental results:

1. Decabromodiphenylethane was found to be the only brominated flame retardant that is both dispersible/compatible in the polyimide system (P-96) that does not phase separate from the polyimide resin domain at the surface (as do unmodified systems) during cure resulting in greatly improved flammability whilst retaining the desirable process characteristics of the system and whose use is not banned in Europe for generation of PBBs during combustion as are decabromodiphenylether, decabromodiphenylmethane and decabromobiphenylether.

2. Addition of a small quantity of decabromodiphenylethane to the resin system in an amount of, for example 3.5% by weight, consistently achieves UL 94 V0 in solder mask (enthone) coated and uncoated multilayer laminates made with b-stage and prepreg of the modified DBDPE formula.

3. Addition of a small quantity of decabromodiphenylethane to the resin system in an amount of, for example 3.5% by weight, reduces within sample variation and sample to sample variation in solder mask coated and uncoated multilayer laminates.

4. Addition of a small quantity of decabromodiphenylethane to the resin reduces surface flame spread.

It is contemplated that various modifications may be made to the compositions, prepregs, laminates and composites of the present invention without departing from the spirit and scope of the invention as defined in the following claims.

What we claim is:

1. A resin composition comprising at least one thermosetting polyimide resin and decabromodiphenylethane, wherein the decambromodiphenylethane is present in the resin composition at about 3.5 wt %.

2. the resin composition of claim 1 including a curing agent.

3. the resin composition of claim 1 including a filler.

4. the resin composition of claim 1 including a toughener.

5. A composite manufactured from the resin composition of claim 1.

6. The resin composition of claim 1 including at least one curing agent that generates free radicals.

7. The resin composition of claim 6 wherein the curing agent is a peroxide curing agent.

8. The resin composition of claim 7 wherein the curing agent is dicumyl peroxide.

9. A prepreg comprising a resin composition and a core material, wherein the resin composition comprises at least one thermosetting polyimide resin and decambromodiphenylethane, wherein the decambromodiphenylethane is present in the resin composition at about 3.5 wt %.

10. The prepreg of claim 9 wherein the resin composition includes an curing agent.

11. The prepreg of claim 9 wherein the resin composition includes a filler.

12. The prepreg of claim 9 wherein the resin composition includes a toughener.

13. A laminate comprising one or more prepregs and one or more sheets of conducting foil, wherein the one or more prepregs comprises a resin composition and a core material, and wherein the resin composition comprises at least one thermosetting polyimide resin and decabromodiphenylethane, wherein the decambromodiphenylethane is present in the resin composition at about 3.5 wt %.

14. The laminate of claim 13 wherein the resin composition includes an curing agent.

15. The laminate of claim 13 wherein the resin composition includes a filler.

16. The laminate of claim 13 wherein the resin composition includes a toughener.

17. A resin composition comprising a polyimide resin, decabromodiphenylethane and methacrylate butadiene styrene core shell particles, wherein the decambromodiphenylethane is present in the resin composition at about 3.5 wt %.

18. A resin composition comprising:
at least polyimide resin;
at least one brominated polycarbonate;
a curing agent; and
and from about 2 to about 5 wt % decabromodiphenylethane.

19. A prepreg including the resin composition of claim 18.

20. A laminate prepared using the resin composition of claim 18.

* * * * *